United States Patent
Bai et al.

(10) Patent No.: US 9,634,274 B2
(45) Date of Patent: Apr. 25, 2017

(54) MONOCHROME OLED AND METHOD FOR MANUFACTURING THE SAME, AND OLED DISPLAY PANEL

(71) Applicants: BOE TECHNOLOGY GROUP CO., LTD., Beijing (CN); ORDOS YUANSHENG OPTOELECTRONICS CO., LTD., Inner Mongolia Autonomous Region (CN)

(72) Inventors: Juanjuan Bai, Beijing (CN); Haidong Wu, Beijing (CN); Taegyu Kim, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 0 days.

(21) Appl. No.: 14/784,205

(22) PCT Filed: Feb. 4, 2015

(86) PCT No.: PCT/CN2015/072211
§ 371 (c)(1),
(2) Date: Oct. 13, 2015

(87) PCT Pub. No.: WO2016/070503
PCT Pub. Date: May 12, 2016

(65) Prior Publication Data
US 2016/0315278 A1     Oct. 27, 2016

(30) Foreign Application Priority Data
Nov. 7, 2014  (CN) .......................... 2014 1 0643039

(51) Int. Cl.
*H01L 51/50* (2006.01)
*H01L 51/00* (2006.01)

(52) U.S. Cl.
CPC ...... *H01L 51/5004* (2013.01); *H01L 51/0035* (2013.01); *H01L 51/5092* (2013.01);
(Continued)

(58) Field of Classification Search
None
See application file for complete search history.

(56) References Cited

U.S. PATENT DOCUMENTS

| | | | |
|---|---|---|---|
| 8,502,202 B2 * | 8/2013 | Nowatari | B82Y 10/00 257/40 |
| 2009/0085474 A1 * | 4/2009 | Shitagaki | H01L 51/5048 313/504 |

FOREIGN PATENT DOCUMENTS

| | | |
|---|---|---|
| CN | 101399319 A | 4/2009 |
| CN | 102414856 A | 4/2012 |

(Continued)

OTHER PUBLICATIONS

Lee, Dong Hyung, Seok Jae Lee, Ja-Ryong Koo, Ho Won Lee, Hyun Su Shin, Song Eun Lee, Woo Young Kim, Kum Hee Lee, Seung Soo Yoon, and Young Kwan Kim. "The Effect of a Charge Control Layer on the Electroluminescent Characteristic of Blue and White Organic Light-Emitting Diodes." Journal of Nanoscience and Nanotechnology 14.8 (2014): 5802-806.*

(Continued)

*Primary Examiner* — Joseph Schoenholtz
(74) *Attorney, Agent, or Firm* — Harness, Dickey & Pierce, P.L.C.

(57) ABSTRACT

The present invention discloses a monochrome OLED and a method for manufacturing the same, and an OLED display panel, which can improve the performance of an OLED. A (Continued)

monochrome OLED according to an embodiment of the invention comprises a luminescent layer, wherein the luminescent layer comprises at least one luminescent sublayer; and at least one carrier control layer that is adjacent to the luminescent sublayer, wherein the carrier control layer is adapted to control the concentration ratio of carriers with different polarities in the luminescent layer.

19 Claims, 5 Drawing Sheets

(52) U.S. Cl.
CPC .......... *H01L 51/005* (2013.01); *H01L 51/006* (2013.01); *H01L 51/0054* (2013.01); *H01L 51/0058* (2013.01); *H01L 51/0059* (2013.01); *H01L 51/0072* (2013.01); *H01L 51/0081* (2013.01); *H01L 51/5012* (2013.01); *H01L 51/5056* (2013.01); *H01L 51/5072* (2013.01); *H01L 51/5096* (2013.01); *H01L 2251/552* (2013.01); *H01L 2251/558* (2013.01)

(56) References Cited

FOREIGN PATENT DOCUMENTS

| CN | 103633246 A | 3/2014 |
|---|---|---|
| CN | 104134754 A | 11/2014 |
| CN | 104319353 A | 1/2015 |
| CN | 204257709 U | 4/2015 |
| DE | 102007020644 A1 | 11/2008 |

OTHER PUBLICATIONS

Bai, Juan-Juan, Xiao-Ming Wu, Yu-Lin Hua, Xue Mu, Wen-Tao Bi, Yue-Ju Su, Zhi-Qiang Jiao, Li-Ying Shen, Shou-Gen Yin, and Jia-Jin Zheng. "Efficiency of a Blue Organic Light-emitting Diode Enhanced by Inserting Charge Control Layers into the Emission Region." Chinese Physics B 22.4 (2013): 047806.*
First Office Action regarding Chinese application No. 201410643039.5, dated Jul. 10, 2015. Translation provided by Dragon Intellectual Property Law Firm.
Second Office Action regarding Chinese application No. 201410643039.5, dated Nov. 26, 2015. Translation provided by Dragon Intellectual Property Law Firm.
Written Opinion of the International Searching Authority for international application No. PCT/CN2015/072211.
High-efficiency blue fluorescence organic light-emitting diodes with DPVBi inserted in the doping emmision layer.
Highly efficient blue fluorescent organic light emitting device with doped double emitting layers based on p-n heterojunction.
Improvement of Performance of a Blue Organic Light-emitting Diode by Inserting Charge Control Layers.
Study about the Structure Improvement and the Performance Enhancement of Blue Organic Light-Emitting Devices.
High efficiency and color-stable white organic light-emitting diodes.

* cited by examiner

MONOCHROME OLED AND METHOD FOR MANUFACTURING THE SAME, AND OLED DISPLAY PANEL

CROSS REFERENCE TO RELATED APPLICATION

The present application is the U.S. national phase of PCT Application No. PCT/CN2015/072211 filed on Feb. 4, 2015, which claims priority to the Chinese patent application No. 201410643039.5, filed on Nov. 7, 2014, the entire content of which is incorporated by reference.

FIELD OF THE INVENTION

The present invention relates to Organic Light Emitting Diode (OLED) technologies, and in particular, to a monochrome OLED and a method for manufacturing the same, and an OLED display panel.

DESCRIPTION OF THE PRIOR ART

Due to the advantages of high efficiency and low voltage for operation, flexibility and plane luminescence, etc., OLED exhibits a wide application prospect in the field of flat panel display and illumination.

No matter in what mode is an OLED used, high-efficient and stable white light is especially important. The white light may be obtained by combining three primary colors, i.e., red, blue and green, or two compensatory light, i.e., blue and orange. Therefore, during the industrialization of white OLED, high-efficient and stable monochrome light plays an irreplaceable role.

For a phosphorescence-doped luminescence system, the application thereof is greatly limited due to various defects. Therefore, at present, more and more OLEDs employ a monochrome luminescent material as a luminescent layer.

Important factors that influence the performance of an OLED include: the concentration difference of the carriers in the luminescent layer and the efficient exciton recombination region in the luminescent layer. Carriers include electrons and holes, and the larger the concentration difference between the electrons and the holes in the luminescent layer is, the poorer the performance of the OLED will be. Similarly, luminescence can only be realized when an electron and a hole recombine in the luminescent layer to form an exciton, and the smaller the efficient exciton recombination region in the luminescent layer is, the fewer the electrons and holes that can be recombined to form excitons will be, thus the poorer the performance of the OLED will be.

In the prior art, the balance of carrier concentrations in the luminescent layer is improved by setting a carrier transport layer and a carrier blocking layer, and changing the host and guest doping materials that are used as the luminescent layer, etc. However, no satisfactory effect can be obtained by such ways. For example, when host and guest doping materials are employed as the luminescent layer, since it is very difficult to control precise doping ratio, the concentration balance of the carriers cannot be realized. For another example, although the manufacturing of the carrier transport layer and the carrier blocking layer, etc., is simple, a certain loss will occur in the current illumination characteristics such as device brightness and efficiency, etc.

Therefore, the OLED produced in the prior art still has a defect that the performance cannot meet the demand.

SUMMARY OF THE INVENTION

It is an object of the present invention to provide a monochrome OLED and a method for manufacturing the same, and an OLED display panel, which can improve the performance of an OLED.

In order to attain the above object, in one embodiment according to the first aspect of the invention, there provides a monochrome OLED. According to the embodiment of the invention, the monochrome OLED includes a luminescent layer, wherein the luminescent layer includes:

at least one luminescent sublayer; and at least one carrier control layer that is adjacent to the luminescent sublayer, wherein the carrier control layer is adapted to control the concentration ratio of carriers with different polarities in the luminescent layer.

Optionally, the concentration ratio is from about 1.5:1 to about 1:1.5.

Optionally, the number of the carrier control layers is 1 or 2.

Optionally, a second material that forms the carrier control layer and a first material that forms the luminescent sublayer have opposite polarities.

Optionally, when the first material is a hole transport-emphasized type material, the second material will be an electron transport-emphasized type material; and when the first material is an electron transport-emphasized type material, the second material will be a hole transport-emphasized type material.

Optionally, the concentration ratio is set according to the thickness of the luminescent sublayer, the thickness of the carrier control layer and the interval mode between the luminescent sublayer and the carrier control layer.

Optionally, the highest occupied molecular orbitals of the first material and the second material meet a first predetermined relationship, and the lowest unoccupied molecular orbitals of the first material and the second material meet a second predetermined relationship, thereby a carrier-controlling electric field is formed.

Optionally, when the first material is of a hole transport-emphasized type, the energy level difference between the highest occupied molecular orbitals of the first material and the second material is ≥0.5 eV, and the energy level difference between the lowest unoccupied molecular orbitals of the first material and the second material should be ≤0.4 Ev; and when the first material is of an electron transport-emphasized type, the energy level difference between the highest occupied molecular orbitals of the first material and the second material is ≤0.5 eV, and the energy level difference between the lowest unoccupied molecular orbitals of the first material and the second material should be ≥0.1 eV.

Optionally, the absorption spectrum of the second material and the luminescence spectrum of the first material do not overlap with each other.

Optionally, the first material that forms the luminescent sublayer is a blue fluorescence dye.

Optionally, the blue fluorescence dye is an anthracene derivative, a perylene derivative, a pyrene derivative or a fluorene derivative.

Optionally, the blue fluorescence dye is DSA-ph, BCz-VBi, 1,4,7,10-tetra(t-butyl) perylene, DPVBI, N-BDAVBi or BDAVBi.

Optionally, the monochrome OLED specifically includes:
an ITO layer;
a hole transport layer formed of NPB;
at least one luminescent sublayer formed of DPVBi;
at least one carrier control layer formed of DSA-Ph;

an electron transport layer formed of BPhen (30 nm);
an electron injection layer formed of LiF (0.6 nm); and
a cathode formed of Al.

Or, the monochrome OLED specifically includes:
an ITO layer;
a hole transport layer formed of NPB;
at least one luminescent sublayer formed of DNCA;
a carrier control layer formed of Alq3;
an electron transport layer formed of BPhen;
an electron injection layer formed of LiF; and
a cathode formed of Al (120 nm).

Or, the monochrome OLED specifically includes:
an ITO layer;
a hole transport layer formed of NPB;
at least one luminescent sublayer formed of DPVBi;
at least one carrier control layer formed of BAlq;
an electron transport layer formed of BPhen;
an electron injection layer formed of LiF; and
a cathode formed of Al.

In order to attain the above object, in one embodiment according to the second aspect of the invention, there further provides a method for manufacturing a monochrome OLED. According to the embodiment of the invention, the method includes a step of forming a luminescent layer, wherein the step of forming a luminescent layer includes:

forming at least one luminescent sublayer; and
forming at least one carrier control layer that is adjacent to the luminescent sublayer, wherein the carrier control layer is adapted to control the concentration ratio of carriers with different polarities in the luminescent layer.

Optionally, the concentration ratio is from about 1.5:1 to about 1:1.5.

Optionally, the second material that forms the carrier control layer and the first material that forms the luminescent sublayer have opposite polarities.

Optionally, the highest occupied molecular orbitals of the first material and the second material meet a first predetermined relationship, and the lowest unoccupied molecular orbitals of the first material and the second material meet a second predetermined relationship, thereby a carrier-controlling electric field is formed.

Optionally, when the first material is of a hole transport-emphasized type, the energy level difference between the highest occupied molecular orbitals of the first material and the second material is ≥0.5 eV, and the energy level difference between the lowest unoccupied molecular orbitals of the first material and the second material is ≤0.4 Ev; and when the first material is of an electron transport-emphasized type, the energy level difference between the highest occupied molecular orbitals of the first material and the second material is ≤0.5 eV, and the energy level difference between the lowest unoccupied molecular orbitals of the first material and the second material should be ≥0.1 eV.

Optionally, the absorption spectrum of the second material and the luminescence spectrum of the first material do not overlap with each other.

In order to attain the above object, in one embodiment according to the third aspect of the invention, there further provides an OLED display panel that includes the above monochrome OLED.

In the embodiments of the invention, as directed to the problem that the monochrome OLED manufactured in the prior art has a poor performance, the concentration ratio of carriers with different polarities in the luminescent layer is controlled by adding a carrier control layer to the luminescent layer, thereby the performance of the OLED can be improved.

BRIEF DESCRIPTION OF THE DRAWINGS

FIG. 4a-FIG. 6 are schematic diagrams showing the experimental results according to one embodiment of the invention.

DETAILED DESCRIPTION OF EMBODIMENTS

In the embodiments of the invention, as directed to the problem that the monochrome OLED manufactured in the prior art has a poor performance, the concentration ratio of carriers with different polarities in the luminescent layer is controlled by adding a carrier control layer to the luminescent layer, thereby the performance of an OLED may be improved.

The monochrome OLED according to one embodiment of the invention includes a luminescent layer; as shown in FIG. 1a-FIG. 1f, the luminescent layer includes:

at least one luminescent sublayer 101; and
at least one carrier control layer 102 that is adjacent to the luminescent sublayer, wherein the carrier control layer 102 is adapted to control the concentration ratio of carriers with different polarities in the luminescent layer.

It may be found from FIG. 1a-FIG. 1f that, in one embodiment of the invention, the number of the luminescent sublayers and the number of the carrier control layers may be equal to each other, or the number of the luminescent sublayers may be greater than that of the carrier control layers by 1, or the number of the luminescent sublayers may be less than that of the carrier control layers by 1. In all the above cases, the function of controlling the concentration ratio of carriers with different polarities in the luminescent layer can be realized, of which the theoretical illustration and the practical simulated illustration will be given later.

The generation of a hole and an electron both requires a certain amount of energy, and the light generated by an OLED comes from an exciton formed by recombining an electron-hole pair. When the hole concentration and the electron concentration are different, a part of the holes or electrons will be unable to be recombined to form excitons, thus this part of redundant holes or electrons cannot be recombined to form carriers of the excitons, and this will cause the loss of carriers and lower the utilization of the carriers, which is unfavorable to improve the performance of the OLED.

Therefore, in an ideal case, when the electron concentration and the hole concentration in the luminescent layer are the same, the performance of the OLED will be highest. However, in consideration that a very high process precision is required to guarantee that the electron concentration and the hole concentration in the luminescent layer are the same, in one embodiment of the invention, the requirement of a practical product may be met by only adding a carrier control layer and controlling the concentration ratio of the electron concentration to the hole concentration in the luminescent layer between 1.5:1 and 1:1.5.

For the monochrome OLED according to one embodiment of the invention, the concentration ratio of carriers with different polarities in the luminescent layer can be controlled, thereby the performance of the OLED can be improved. This will be explained as follows.

An exciton is an unstable electron-hole pair formed of an electron and a hole in a substance with a luminescent characteristic, and finally it returns to a stable ground state by releasing energy in the form of light or heat. The form in which the exciton returns to the stable ground state is closely related to the exciton concentration. If the region in which the excitons are formed is too narrow, the concentration of the excitons in the very narrow recombination region will be too large, and a too large exciton concentration will cause the quenching of excitons, that is, the excitons return to the ground state in the form of heat energy, rather than in the form of light energy, thus the performance of the OLED will be lowered. In one embodiment of the invention, due to adding of the carrier control layer, the recombination region of the excitons is enlarged, and the exciton concentration in the recombination region is lowered. Thus the occurrence of exciton quenching (that is, the excitons return to the ground state in the form of heat energy) will be reduced, and the ratio of the case in which the excitons return to the ground state in the form of light energy will be increased, thereby the performance of the OLED will be improved.

In the prior art, when host and guest doping materials are employed as the luminescent layer, it is difficult to achieve a very precise doping ratio, thus it cannot achieve the balance of carrier concentration. However, in the method according to an embodiment of the invention, viewing from the manufacturing process, it may be achieved by employing multilayer sequential evaporation. Moreover, very precise size control may be realized by evaporation, it may be achieve more easily in comparison with the doping ratio control of host and guest doping, and it has a good repeatability. Therefore, precise carrier concentration balance can be achieved in a process flow that is relative simple and has a low cost.

In one embodiment of the invention, the carrier control layer may be achieved in various modes. Several possible modes will be illustrated below, but it will not be regarded as limiting the protection scope of the invention.

Embodiment 1

In the embodiment 1, it realizes that the second material that forms the carrier control layer and the first material that forms the luminescent sublayer have opposite polarities, so as to control the concentration ratio of carriers with different polarities in the luminescent layer.

In physics, a carrier (Charge Carrier) refers to a charged particle that may move freely; and in semiconductor, an electron or a hole becomes a carrier.

Organic charge transport material is a type of organic semiconductor material that may realize the oriented, ordered and controllable migration of a carrier under the action of an electric field so as to transport a charge when a carrier (electron or hole) is injected, and it includes both hole transport-emphasized type (P type) material and electron transport-emphasized type (N type) material. For example, the hole transport-emphasized type material that forms the luminescent sublayer includes:

DSA-ph (1,4-bi[4-(N,N-diphenyl)amino]styrylbenzene);
DNCA (N6,N6,N12,N12-tetra-methylphenylchrysene-6,12-diamine, metamethylphenylchrysene);
BDAVBi (4,4'-bis[4-(diphenylamino)styryl]biphenyl); and
N-BDAVBi, etc.

For example, the electron transport-emphasized type material that forms the luminescent sublayer includes:

$Alq_3$ (tris(8-hydroxyquinolinato)aluminum);
ADN (9,10-bi(2-naphthyl)anthracene);
TBPe (1,4,7,10-tetra-t-butyl perylene); and
DPVBi ([4,4'-(2,2-styryl)-1,1'-biphenyl]), etc.

When a unipolar material is used for the luminescent sublayer, it is hypothesized that its transport polarity is the first polarity (which may be N type or P type). In one embodiment of the invention, in order to control the concentration ratio of carriers with different polarities in the luminescent layer, a carrier control layer is introduced, and because the transport polarity of the material thereof is opposite to that of the material used for the luminescent sublayer, that is, they have opposite polarities, the concentration ratio of carriers in the luminescent layer may be controlled by controlling the thickness difference and the interval between the luminescent layer and the carrier control layer.

For example, when the concentration ratio of carriers in the luminescent layer cannot meet the requirement, if it is required to improve the concentration ratio of electrons in the luminescent layer, it may be realized by increasing the thickness of the N type-emphasized material or lowering the thickness of the P type-emphasized material; and if it is required to improve the concentration ratio of the holes in the luminescent layer, it may be realized by increasing the thickness of the P type-emphasized material or lowering the thickness of the N type-emphasized material.

That is to say, in the embodiment of the invention, when the first material is a hole transport-emphasized type material, the second material will be an electron transport-emphasized type material; and when the first material is an electron transport-emphasized type material, the second material will be a hole transport-emphasized type material; thereby, the concentration ratio of carriers in the luminescent layer may be controlled by controlling the thickness and the layer interval mode of the layered structure formed of the first material and the second material. That is, the concentration ratio of carriers may be set according to the thickness of the luminescent sublayer, the thickness of the carrier control layer and the interval mode between the luminescent sublayer and the carrier control layer.

Embodiment 2

In the Embodiment 2, by selecting the material, a certain potential barrier is formed in the luminescent layer, which blocks a part of the carrier from continuing to strike into the luminescent layer, so that the carriers that cannot continue to enter into the luminescent layer will be accumulated in the luminescent layer and form a carrier-controlling electric field, thereby the concentration ratio of carriers with different polarities in the luminescent layer can be controlled by the carrier-controlling electric field.

The forming of the above carrier-controlling electric field may be realized by the highest occupied molecular orbitals (HOMO) and the lowest unoccupied molecular orbitals (LUMO) of the first material and the second material.

The HOMO energy level difference between two materials will influence the injection of holes, and the LUMO energy level difference between two materials will influence the injection of electrons, the larger the HOMO energy level difference is, the stronger the ability of blocking the holes will be, and the larger the LUMO energy level difference is, the stronger the ability of blocking the electrons will be.

Therefore, when it is required to improve the electron concentration in the luminescent layer, a material that has a small LUMO energy level difference with the luminescent layer material may be selected as the carrier control layer, so that the LUMO energy level difference may be reduced, the injection of electrons may be strengthened, and the electron concentration in the luminescent layer may be improved.

However, when it is required to improve the hole concentration in the luminescent layer, a material that has a smaller HOMO energy level difference with the luminescent layer material may be selected as the carrier control layer, so that the HOMO energy level difference may be reduced, the injection of holes may be strengthened, and the hole concentration in the luminescent layer may be improve.

This will be illustrated as follows.

Figure 1A:
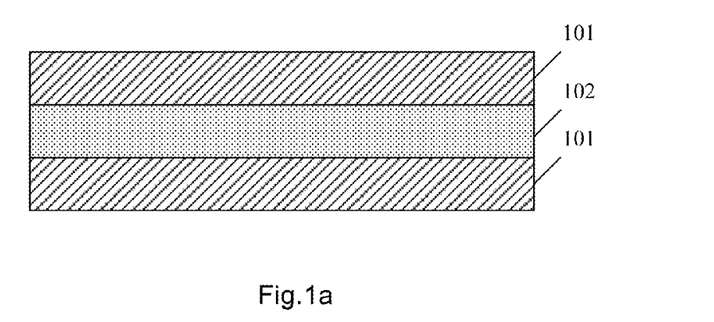
FIG. 1a-FIG. 1f show structural representations of a luminescent layer in the monochrome OLED according to one embodiment of the invention.
Figure 1B:
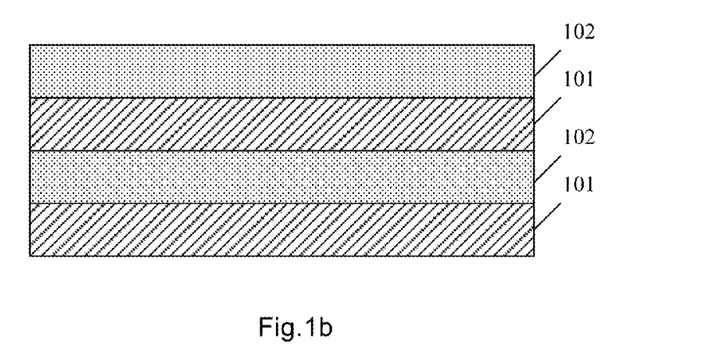
Figure 1C:
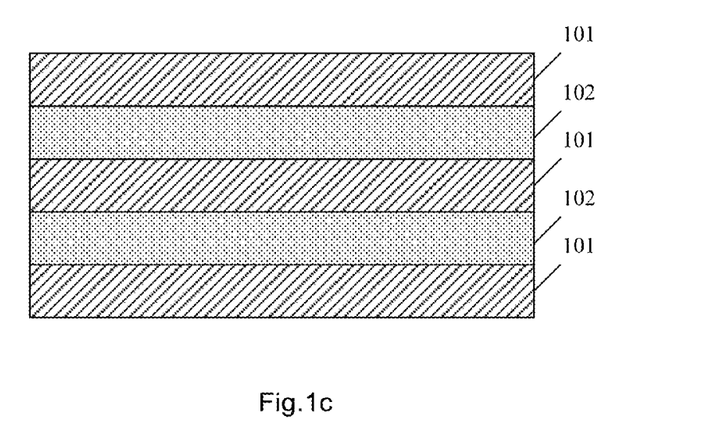
Figure 1D:
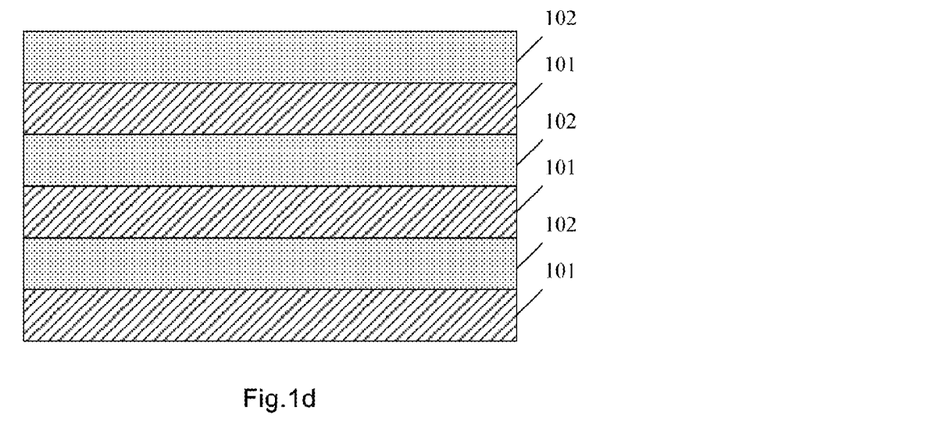
Figure 1E:
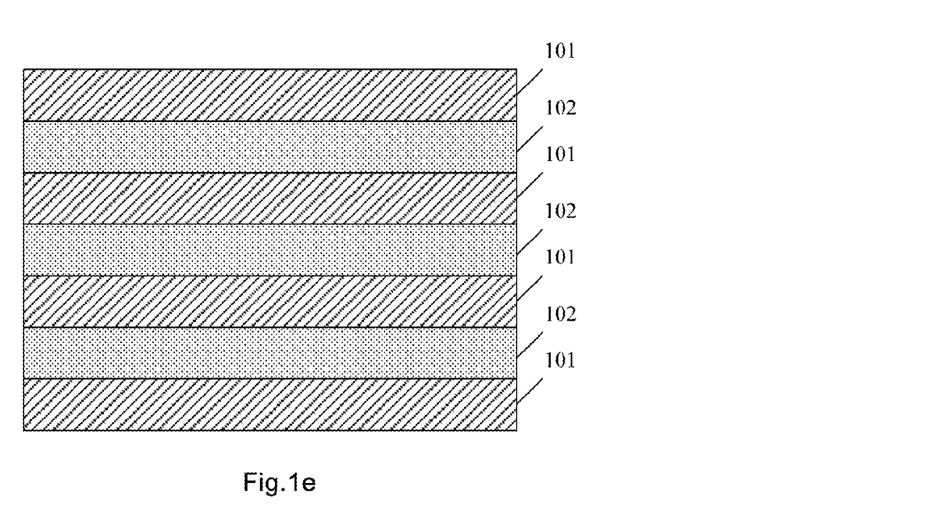
Figure 1F:
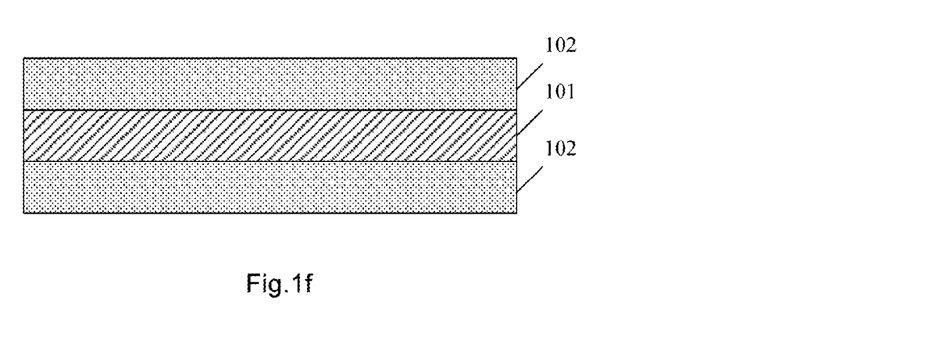
Figure 2:
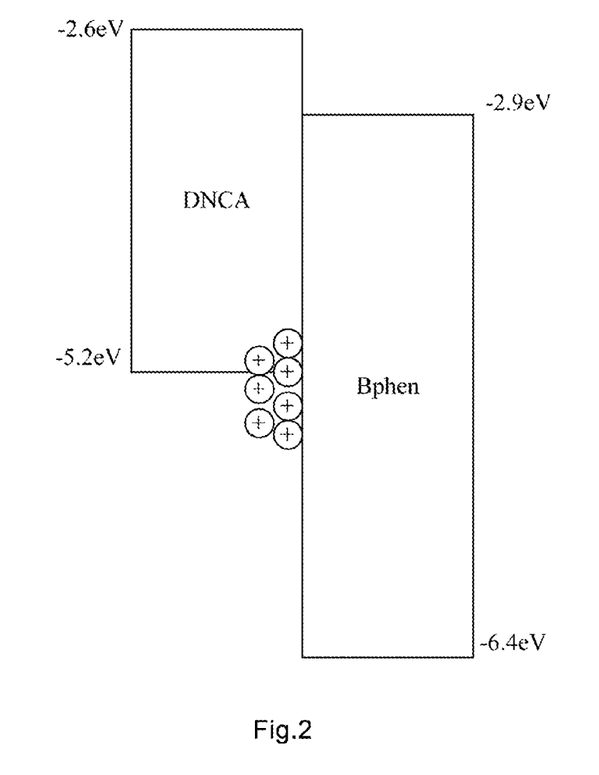
FIG. 2 shows a schematic diagram of the potential barrier formed between the luminescent sublayer and the carrier control layer.

As shown in FIG. 2, it shows a schematic diagram of HOMO and LUMO of DNCA (N6,N6,N12,N12-tetra-methylphenylchrysene-6,12-diamine, metamethylphenyl-chrysene) and BPhen (4,7-diphenyl-1,10-orthophenanthroline). It may be found from FIG. 2 that, the HOMO energy level of DNCA is −2.6 eV, the LUMO energy level of DNCA is −5.2 eV, and the HOMO energy level of BPhen is −2.9 eV, the LUMO energy level of BPhen is −6.4 eV, therefore the HOMO energy level difference between DNCA and Bphen is only 0.3 eV. That is, the difference between the HOMO energy level of DNCA (−2.6 eV) and the HOMO energy level of Bphen (−2.9 eV) is relatively small, and thus a large amount of holes can overcome the above energy level difference of 0.3 eV, transport in DNCA and reach the boundary of DNCA and Bphen. However, for an electron, if it is required to pass through DNCA and be transported to Bphen, it needs to overcome a LUMO energy level difference of 1.2 eV, that is, the difference between the LUMO energy level (−5.2 eV) of DNCA and the LUMO energy level (−6.4 eV) of Bphen. For electrons, this is a very large energy level difference that is difficult to overcome. Therefore, the blocking of electrons is realized.

In the embodiment of the invention, in order to guarantee that the concentration ratio of electrons to holes is between 1.5:1–1:1.5, when the first material is of a hole transport-emphasized type, the HOMO energy level difference between the first material and the second material is ≥0.5 eV, and the LUMO energy level difference between the first material and the second material should be ≤0.4 eV; and when the first material is of an electron transport-emphasized type, the HOMO energy level difference between the first material and the second material is ≤0.5 eV, and the LUMO energy level difference between the first material and the second material should be ≥0.1 eV. That is to say, in the embodiment of the invention, by selecting different materials of which the HOMO and the LUMO respectively meet a certain relation, a potential barrier that attracts or blocks carriers may be formed in the luminescent layer, thereby the concentration ratio of carriers with different polarities in the luminescent layer may be influenced.

For what material is to be employed to meet the concentration ratio of carriers with different polarities in the luminescent layer, it may be determined by persistent experiments.

It should be understood that the above two modes do not conflict with each other, and the two modes may be used in conjunction.

In the embodiment of the invention, luminescence is mainly realized by the first material. However, since a carrier control layer is added, in order to prevent the carrier control layer added in the embodiment of the invention from influencing the light beams generated by the luminescent layer, in an exemplary realization mode, it guarantees that the absorption spectrum of the second material that forms the carrier control layer and the luminescence spectrum of the first material that forms the luminescent sublayer do not overlap with each other.

By controlling the absorption spectrum, the light beams emitted by the first material will not be absorbed by the second material, thus the luminescence efficiency of the monochrome OLED will not be lowered in the embodiment of the invention.

The monochrome OLED according to the embodiment of the invention may be a fluorescent OLED of various colors, wherein, in an exemplary realization mode, the monochrome OLED is a blue light OLED, and the first material that forms the luminescent sublayer is a blue fluorescence dye.

The blue fluorescence dye may be an anthracene derivative, a perylene derivative, a pyrene derivative or a fluorene derivative.

Figure 3:
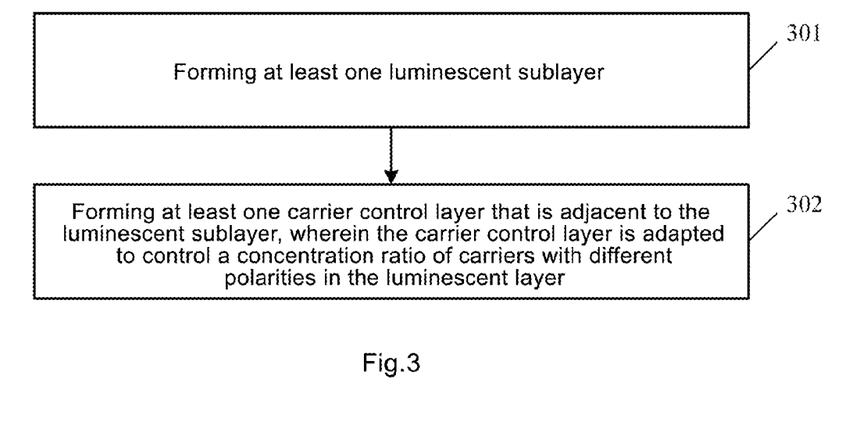
FIG. 3 shows a schematic flow chart of a method for manufacturing a monochrome OLED according to one embodiment of the invention.

The blue fluorescence dye may also be DSA-ph (1,4-bi [4-(N,N-diphenyl)amino]styrylbenzene), BCzVBi (4,4'-bis (9-ethyl-3-carbazolylvinyl)-1,1'-biphenyl), TBPe (1,4,7,10-tetra-t-butyl perylene), DPVBi ([4,4'-(2,2-styryl)-1,1'-biphenyl]), BDAVBi (4,4'-bis[4-(diphenylamino)styryl] biphenyl) or N-BDAVBi. An embodiment of the invention further provides a method for manufacturing a monochrome OLED, which includes a step of forming a luminescent layer; as shown in FIG. 3, the step of forming a luminescent layer specifically includes:

Step 301: forming at least one luminescent sublayer; and

Step 302: forming at least one carrier control layer that is adjacent to the luminescent sublayer, wherein the carrier control layer is adapted to control the concentration ratio of carriers with different polarities in the luminescent layer.

The controlling of the concentration ratio of carriers with different polarities may be realized in the two modes below.

The second material that forms the carrier control layer and the first material that forms the luminescent sublayer have opposite polarities so as to control the concentration of carriers with different polarities in the luminescent layer; and The HOMOs of the first material and the second material meet a first predetermined relationship, and the LOMOs of the first material and the second material meet a second predetermined relation, thereby a carrier-controlling electric field is formed, wherein the carrier-controlling electric field is adapted to control the concentration ratio of carriers with different polarities in the luminescent layer.

During the process of manufacturing a whole LED, first of all, the ITO layer is etched into a required pattern according to a designed mask plate, and then the substrate thereof is cleaned and treated in turn by an organic solvent and ozone, etc. Next, the ITO substrate is placed into a vacuum coating machine, and when the pressure intensity in the chamber is lowered to $2 \times 10^{-4}$ Pa, a hole transport layer, a luminescent layer including a carrier control layer structure, an electron transport layer, an electron injection layer and a cathode are in turn evaporated on the ITO layer. Finally, the ITO plane is correspondingly encapsulated by a glass cover plate.

In order to guarantee the luminescence efficiency of a fluorescent OLED, the absorption spectrum of the second material that forms the carrier control layer and the luminescence spectrum of the first material that forms the luminescent sublayer do not overlap with each other.

In order to attain the above object, an embodiment of the invention further provides an OLED display panel that includes the above monochrome OLED.

The fluorescent OLED according to the embodiment of the invention will be experimentally verified as follows.

Embodiment 3

An OLED A manufactured in the prior art is as follows, which in turn includes an ITO, a hole transport layer formed of NPB (N,N-diphenyl-N,N-bi(1-naphthyl)-1,1'-biphenyl-4,4'-diamine) (40 nm), a luminescent layer formed of DPVBi (4,4'-bi(2,2-di-styryl)-1,1'-biphenyl) (30 nm), an electron transport layer formed of BPhen (4,7-diphenyl-1,10-orthophenanthroline) (30 nm), an electron injection layer formed of LiF (lithium fluoride) (0.6 nm) and a cathode formed of Al (aluminum) (120 nm).

An OLED B according to one embodiment of the invention is as follows, which in turn includes: an ITO, a hole transport layer formed of NPB (40 nm), a luminescent sublayer formed of DPVBi (10 nm), a carrier control layer formed of DSA-Ph (1,4-bi[4-(N,N-diphenyl)-amino]styrylbenzene) (5 nm), a luminescent sublayer formed of DPVBi (20 nm), an electron transport layer formed of BPhen (30 nm), an electron injection layer formed of LiF (0.6 nm) and a cathode formed of Al (120 nm);

Another OLED C according to one embodiment of the invention is as follows, which in turn includes: an ITO, a hole transport layer formed of NPB (40 nm), a luminescent sublayer formed of DPVBi (20 nm), a carrier control layer formed of DSA-Ph (5 nm), a luminescent sublayer formed of DPVBi (10 nm), an electron transport layer formed of BPhen (30 nm), an electron injection layer formed of LiF (0.6 nm) and a cathode formed of Al (120 nm).

Figure 4A:
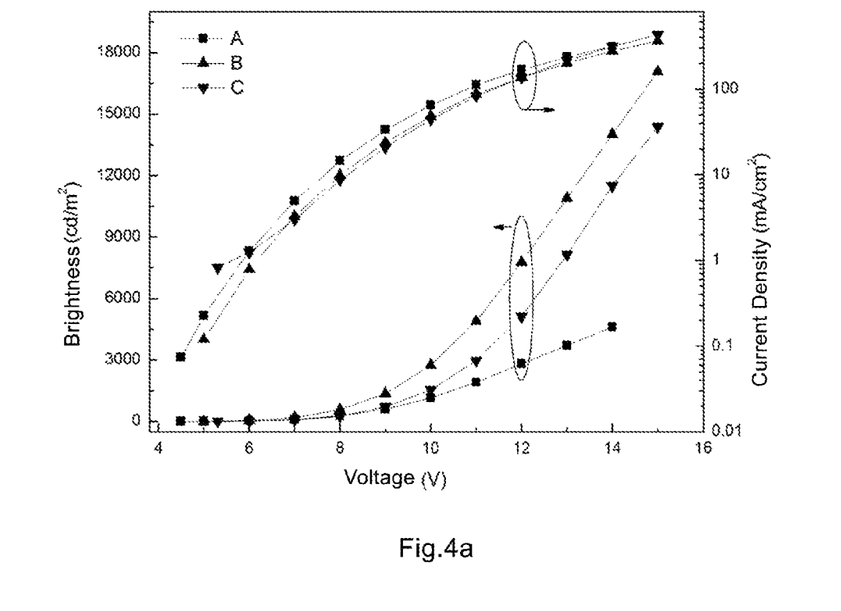
Figure 6:
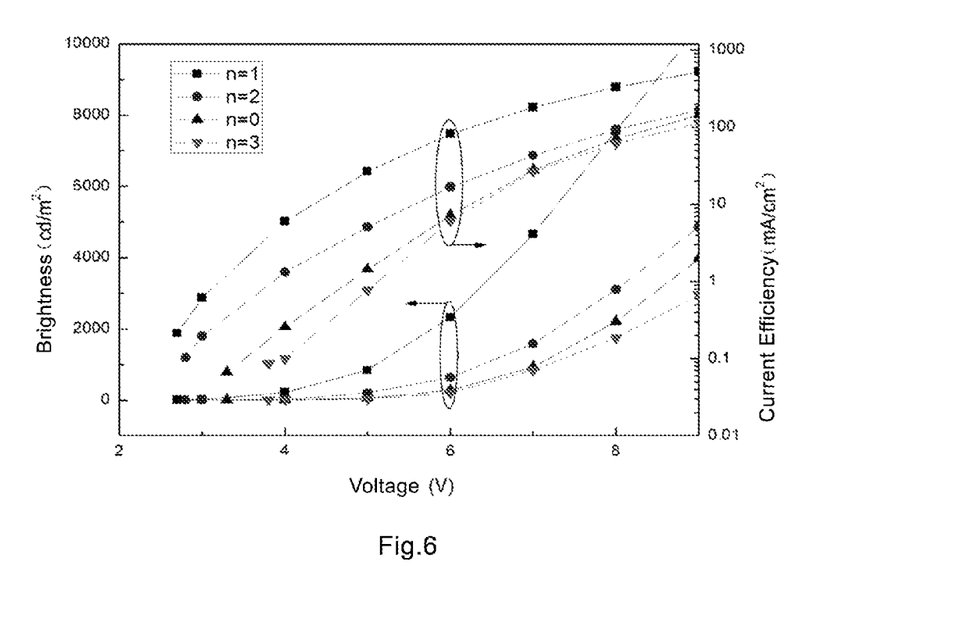

FIG. 4a shows a graph of compared test data of voltage-current density and voltage-brightness of the above 3 OLEDs. It may be found from FIG. 4a (wherein, the arrows in FIG. 4a and FIG. 6 represent the direction in which the axis of ordinate corresponding to the curve exists, that is, in FIG. 4a and FIG. 6, the upper set of curves are voltage-current density curves, and the lower set of curves are voltage-brightness curves) that: relative to the OLED A of the prior art, the OLED B and C according to the embodiments of the invention can reach a higher brightness at the same drive voltage.

Figure 4B:
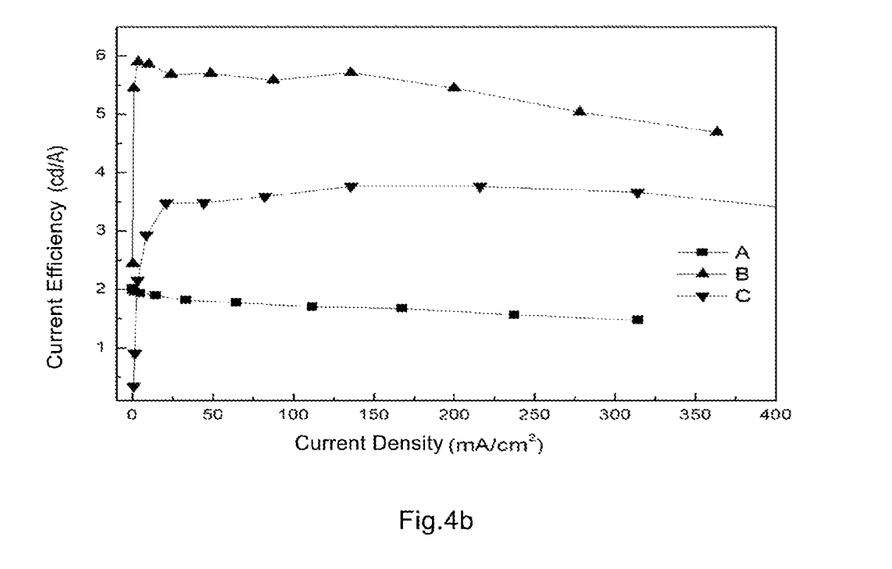

FIG. 4b shows a graph of compared test data of current density-current efficiency of the above 3 OLEDs, and it may be found from FIG. 4b that: relative to the OLED A of the prior art, the OLED B and C according to the embodiments of the invention can reach a higher current efficiency at the same current density, and the improving of current efficiency is very significant.

Therefore, in conclusion, relative to the OLED A of the prior art, the OLED B and C according to the embodiments of the invention can reach a higher brightness and a higher current efficiency at the same drive voltage, but the current densities of the three has no significant difference.

Embodiment 4

An OLED A manufactured in the prior art (n=0, with no carrier control layer) is as follows, which in turn includes: an ITO, a hole transport layer formed of NPB (40 nm), a luminescent layer formed of DNCA (20 nm), an electron transport layer formed of BPhen (30 nm), an electron injection layer formed of LiF (0.6 nm) and a cathode formed of Al (120 nm).

An OLED according to one embodiment of the invention (n=1, with one carrier control layer) is as follows, which in turn includes: an ITO, a hole transport layer formed of NPB (40 nm), a luminescent sublayer formed of DNCA (10 nm), a carrier control layer formed of $Alq_a$ (tris(8-hydroxyquinolinato)aluminum) (5 nm), a luminescent sublayer formed of DNCA (10 nm), an electron transport layer formed of BPhen (30 nm), an electron injection layer formed of LiF (0.6 nm) and a cathode formed of Al (120 nm).

Another OLED according to one embodiment of the invention (n=2, with two carrier control layers) is as follows, which in turn includes: an ITO, a hole transport layer formed of NPB (40 nm), a luminescent sublayer formed of DNCA (7 nm), a carrier control layer formed of $Alq_3$ (2.5 nm), a luminescent sublayer formed of DNCA (7 nm), a carrier control layer formed of $Alq_3$ (2.5 nm), a luminescent sublayer formed of DNCA (7 nm), an electron transport layer formed of BPhen (30 nm), an electron injection layer formed of LiF (0.6 nm) and a cathode formed of Al (120 nm).

Figure 5:
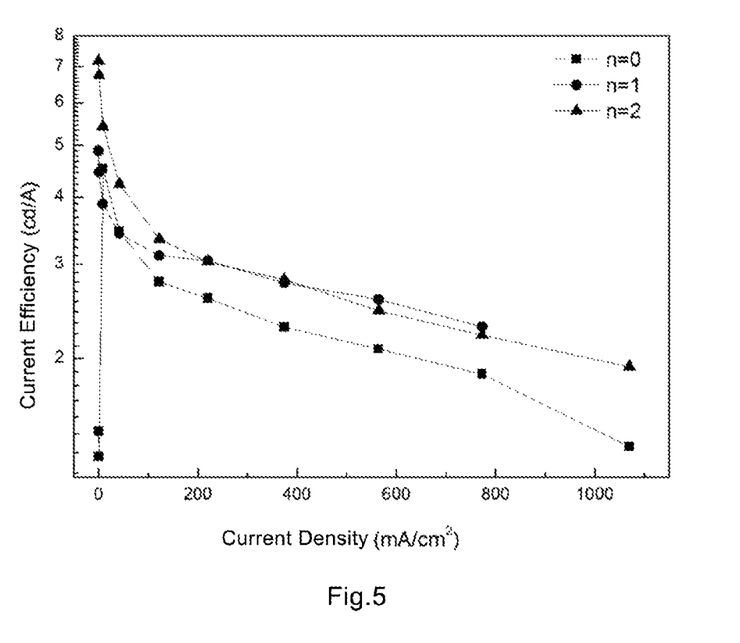

FIG. 5 shows a graph of compared test data of current density-current efficiency of the above 3 OLEDs, and it may be found from FIG. 5 that: relative to the OLED (n=0) of the prior art, the OLED (n=1, 2) according to the embodiments of the invention have higher current efficiency.

Embodiment 5

An OLED A manufactured in the prior art (n=0, with no carrier control layer) is as follows, which in turn includes: an ITO, a hole transport layer formed of NPB (40 nm), a luminescent layer formed of DPVBi (30 nm), an electron transport layer formed of BPhen (30 nm), an electron injection layer formed of LiF (0.6 nm) and a cathode formed of Al (120 nm).

An OLED (n=1, with one carrier control layer) according to one embodiment of the invention is as follows, which in turn includes: an ITO, a hole transport layer formed of NPB (40 nm), a luminescent sublayer formed of DPVBi (15 nm), a carrier control layer formed of BAlq (bis(2-methyl-8-hydroxyquinolinato-N1,O8)-(1,1'-biphenyl-4-hydroxy)aluminum) (5 nm), a luminescent sublayer formed of DPVBi (15 nm), an electron transport layer formed of BPhen (30 nm), an electron injection layer formed of LiF (0.6 nm) and a cathode formed of Al (120 nm).

Another OLED (n=2, with two carrier control layers) according to one embodiment of the invention is as follows, which in turn includes: an ITO, a hole transport layer formed of NPB (40 nm), a luminescent sublayer formed of DPVBi (10 nm), a carrier control layer formed of BAlq (2.5 nm), a luminescent sublayer formed of DPVBi (10 nm), a carrier control layer formed of BAlq (2.5 nm), a luminescent sublayer formed of DPVBi (10 nm), an electron transport layer formed of BPhen (30 nm), an electron injection layer formed of LiF (0.6 nm) and a cathode formed of Al (120 nm).

A further OLED (n=3, with three carrier control layers) according to one embodiment of the invention is as follows, which in turn includes: an ITO, a hole transport layer formed of NPB (40 nm), a luminescent sublayer formed of DPVBi (7.5 nm), a carrier control layer formed of BAlq (1.6 nm), a luminescent sublayer formed of DPVBi (7.5 nm), a carrier control layer formed of BAlq (1.6 nm), a luminescent sublayer formed of DPVBi (7.5 nm), a carrier control layer formed of BAlq (1.6 nm), a luminescent sublayer formed of DPVBi (7.5 nm), an electron transport layer formed of BPhen (30 nm), an electron injection layer formed of LiF (0.6 nm) and a cathode formed of Al (120 nm).

FIG. 6 shows a graph of compared test data of voltage-current density and voltage-brightness of the above 4 OLEDs, and it may be found from FIG. 6 that: relative to the OLED of the prior art, the current density and the brightness of the OLED (n=1 and n=2) according to the embodiments of the invention are both improved, which benefits from the reinforcement of the electron transport ability in the luminescent layer. At the same time, when BAlq is employed as the carrier control layer, the HOMO energy level of DPVBi is the same as the HOMO energy level of BAlq, and the LUMO energy level difference between BAlq and BPhen is 0.1 eV, thus in each different luminescent layer, the holes exhibit a phenomenon of regressive concentration. On the contrary, a potential barrier of 0.1 eV is favorable for the electrons to enter into the luminescent layer from the electron transport layer, and the strong electron transport ability of BAlq itself is also favorable for the electrons to be transported in the luminescent layer, thus it is favorable for the balance of electron-hole pairs, so that the brightness of the device may be increased. However, as the number of carrier control layers increases, the number of interfaces of the organic materials will also increase correspondingly, ant this will introduce film-forming defects to a certain extent, which is unfavorable for the transport of carriers and lowers the performance of the device. Therefore, in this device, when n=3, the current density and brightness of the device both slightly decrease.

Therefore, in the embodiments of the invention, the number of carrier control layers is less than or equal to 2.

In the embodiments of the invention, by adding a carrier control layer, the electron concentration and hole concentration in the luminescent layer is made at a suitable ratio, the electrons or holes that cannot be recombined to form excitons are reduced greatly, the utilization of the carriers is improved, and the performance of the OLED is improved.

At the same time, in the embodiment of the invention, due to the adding of a carrier control layer, the recombination region of excitons is extended, and the exciton concentration is lowered, so that the occurrence of exciton quenching (that is, the excitons return to the ground state in the form of heat energy) will be reduced, the ratio of the case in which the excitons return to the ground state in the form of light energy will be increased, thereby the performance of the OLED can be improved.

The above description only shows some preferred embodiments of the invention. It should be pointed that, for one of ordinary skills in the art, various improvements and modifications may also be made without departing from the principles of the invention, and these improvements and modifications should also be regarded as the protection scope of the invention.

What is claimed is:

1. A monochrome organic light-emitting diode (OLED), comprising a luminescent layer, wherein the luminescent layer comprises:
    at least one luminescent sublayer; and
    a pair of carrier control layers that sandwich the luminescent sublayer,
    wherein the carrier control layers are adapted to control a concentration ratio of carriers with different polarities in the luminescent layer,
    the luminescent sublayer is formed of DPVBi, and
    the carrier control layers are formed of BAlq.

2. The monochrome OLED according to claim 1, wherein the concentration ratio is from about 1.5:1 to about 1:1.5.

3. The monochrome OLED according to claim 1, wherein a second material that forms the carrier control layer and a first material that forms the luminescent sublayer have opposite polarities.

4. The monochrome OLED according to claim 3, wherein when the first material is a hole transport-emphasized type material, the second material will be an electron transport-emphasized type material; and when the first material is an electron transport-emphasized type material, the second material will be a hole transport-emphasized type material.

5. The monochrome OLED according to claim 1, wherein the concentration ratio is set according to a thickness of the luminescent sublayer, a thickness of the carrier control layer and an interval mode between the luminescent sublayer and the carrier control layer.

6. The monochrome OLED according to claim 3, wherein the highest occupied molecular orbitals of the first material and the second material meet a first predetermined relationship, and the lowest unoccupied molecular orbitals of the first material and the second material meet a second predetermined relationship, so that a carrier-controlling electric field is formed.

7. The monochrome OLED according to claim 6, wherein, when the first material is of a hole transport-emphasized type, an energy level difference between the highest occupied molecular orbitals of the first material and the second material is ≥0.5 eV, and an energy level difference between the lowest unoccupied molecular orbitals of the first material and the second material is ≤0.4 eV; and when the first material is of an electron transport-emphasized type, the energy level difference between the highest occupied molecular orbitals of the first material and the second material is ≤0.5 eV, and the energy level difference between the lowest unoccupied molecular orbitals of the first material and the second material is ≥0.1 eV.

8. The monochrome OLED according to claim 3, wherein the absorption spectrum of the second material and the luminescence spectrum of the first material do not overlap with each other.

9. The monochrome OLED according to claim 3, wherein the monochrome OLED is a blue fluorescence OLED.

10. The monochrome OLED according to claim 9, wherein a blue fluorescence dye used by the blue fluorescence OLED is an anthracene derivative, a perylene derivative, a pyrene derivative or a fluorene derivative.

11. The monochrome OLED according to claim 9, wherein the blue fluorescence dye used by the blue fluorescence OLED is DSA-ph, BCzVBi, TBPe, DPVBI, N-BDAVBi or BDAVBi.

12. The monochrome OLED according to claim 11, wherein the monochrome OLED comprises:
    an ITO layer;
    a hole transport layer formed of NPB;
    an electron transport layer formed of BPhen;
    an electron injection layer formed of LiF; and
    a cathode formed of Al.

13. A method for manufacturing a monochrome organic light-emitting diode (OLED), comprising a step of forming a luminescent layer, wherein the step of forming the luminescent layer comprises:
    forming at least one luminescent sublayer; and
    forming a pair of carrier control layers that sandwich the luminescent sublayer,
    wherein the carrier control layers are adapted to control a concentration ratio of carriers with different polarities in the luminescent layer,
    the luminescent sublayer is formed of DPVBi, and
    the carrier control layers are formed of BAlq.

14. The method according to claim 13, wherein the concentration ratio is from about 1.5:1 to about 1:1.5.

15. The method according to claim 13, wherein a second material that forms the carrier control layer and a first material that forms the luminescent sublayer have opposite polarities.

16. The method according to claim 15, wherein the highest occupied molecular orbitals of the first material and the second material meet a first predetermined relationship, and the lowest unoccupied molecular orbitals of the first material and the second material meet a second predetermined relationship, so that a carrier-controlling electric field is formed.

17. The method according to claim 16, wherein, when the first material is of a hole transport-emphasized type, an energy level difference between the highest occupied molecular orbitals of the first material and the second material is $\geq 0.5$ eV, and an energy level difference between the lowest unoccupied molecular orbitals of the first material and the second material is $\leq 0.4$ eV; and when the first material is of an electron transport-emphasized type, the energy level difference between the highest occupied molecular orbitals of the first material and the second material is $\leq 0.5$ eV, and the energy level difference between the lowest unoccupied molecular orbitals of the first material and the second material is $\geq 0.1$ eV.

18. The method according to claim 15, wherein the absorption spectrum of the second material and the luminescence spectrum of the first material do not overlap with each other.

19. An organic light-emitting diode (OLED) display panel, comprising the monochrome OLED according to claim 1.

* * * * *